United States Patent
Ookawa

(10) Patent No.: US 6,498,486 B1
(45) Date of Patent: Dec. 24, 2002

(54) FLEXIBLE PREPARATORY MR IMAGING

(75) Inventor: Masashi Ookawa, Otawara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/644,973

(22) Filed: Aug. 24, 2000

(30) Foreign Application Priority Data

Aug. 25, 1999 (JP) .......................................... 11-238772

(51) Int. Cl.$^7$ ................................................ G01V 3/00
(52) U.S. Cl. ........................ 324/312; 324/307; 324/309
(58) Field of Search ................................. 324/312, 318, 324/307, 309; 600/443, 420, 410

(56) References Cited

U.S. PATENT DOCUMENTS

| | | | | |
|---|---|---|---|---|
| 5,384,861 A | * | 1/1995 | Mattson et al. ................. | 382/6 |
| 5,740,267 A | * | 4/1998 | Echerer et al. ............. | 382/132 |
| 5,757,952 A | * | 5/1998 | Buytaert et al. ............. | 382/132 |
| 5,830,143 A | * | 11/1998 | Mistretta et al. ............. | 600/420 |
| 6,081,577 A | * | 6/2000 | Webber ........................ | 378/23 |
| 6,086,537 A | * | 7/2000 | Urbano et al. ............... | 600/443 |
| 6,228,030 B1 | * | 5/2001 | Urbano et al. ............... | 600/443 |
| 6,275,721 B1 | * | 8/2001 | Darrow et al. ............... | 324/318 |

* cited by examiner

Primary Examiner—Edward Lefkowitz
Assistant Examiner—Dixomara Vargas
(74) Attorney, Agent, or Firm—Nixon & Vanderhye P.C.

(57) ABSTRACT

While monitor images continuously generated by a monitor scan are displayed, the parent image of a difference image may be updated at any particular point in time. Further, during the display, the image may be switched between a normal reconstructed image and a difference image, and the difference method applied to the presently displayed difference image may be changed. When the body of a to-be-examined subject has moved, or the inflow effect of breathing, blood, etc. has occurred, and therefore the parent image of the presently displayed difference image is considered to become inappropriate, the operator may input an instruction to update the parent image.

17 Claims, 5 Drawing Sheets

FLEXIBLE PREPARATORY MR IMAGING

CROSS-REFERENCES TO RELATED APPLICATIONS

This application is based upon and claims the benefit of priority from the prior Japanese Patent Application No. 11-238772, filed Aug. 25, 1999, the entire contents of which are incorporated herein by reference.

BACKGROUND OF THE INVENTION

This invention relates to a magnetic resonance imaging apparatus configured to use magnetic resonance (MR) to obtain a magnetic resonance image of a to-be-examined subject, and more particularly to a magnetic resonance imaging apparatus designed to perform a monitor scan for observing the flow of a contrast agent injected into a to-be-examiner subject, and perform an imaging scan for acquiring a photographic image when it is confirmed that the contrast agent has reached a diagnostic region in the subject.

In the field of magnetic resonance imaging apparatuses, several imaging methods suitable for particular diagnosis are proposed. Some MR contrast imaging methods use a function entitled "Visual Prep". In MR contrast imaging methods using the Visual Prep function, a contrast agent is injected into a to-be-examined subject, and a monitor scan is executed. During the monitor scan, a plurality of monitor images are continuously generated and displayed on a monitor. The operator observes the flow of the contrast agent based on monitor images.

Upon confirming the arrival of the contrast agent at the desired diagnostic region, the operator inputs an instruction to execute an imaging scan. By the imaging scan, an MR contrast image to be used for diagnosis can be acquired at an appropriate point in time. A preparatory function that performs the monitor scan may be called a "Visual Prep" function.

The conventional technique using a Visual Prep function, however, is disadvantageous in that it cannot follow movement of the to-be-photographed subject (for example, movement of the human body), which occurs during the monitor scan. Specifically, in a conventional Visual Prep function, a mask image (a parent image) of the to-be-examined subject acquired at the initial stage, and a plurality of live images acquired at regular intervals are used. Each time a live image is acquired, the mask image and the live image are subjected to subtraction processing, and the resultant subtraction image is displayed on the monitor. Further, in a conventional Visual Prep function, the live image is updated at regular intervals, while the mask image is not updated but, instead, the initial mask image is used at all times. Therefore, when the to-be-examined subject moves, subtraction processing cannot be executed appropriately, resulting in an inappropriate monitor image.

Once the inappropriate monitor image is displayed, the operator cannot clearly observe the flow of contrast agent. This means that the operator may miss the desired timing for inputting an instruction to execute an imaging scan, and hence may fail to acquire a desired MR contrast image.

BRIEF SUMMARY OF THE INVENTION

The present invention has been developed in light of the above, and aims to provide a magnetic resonance imaging apparatus which can more effectively display a monitor image showing the flow of contrast agent into a to-be-examined subject, thereby enabling the operator to determine appropriate timing for an imaging scan and hence more easily obtain a desired MR image.

According to the present invention there is provided an image display method employed in a magnetic resonance imaging apparatus that executes preparatory imaging, comprising the steps of: collecting a series of magnetic resonance images of a to-be-examined subject, which are to be used for preparatory imaging; determining at least one of the series of magnetic resonance images to be a parent image; creating a difference image between a latest one of the series of magnetic resonance images and the parent image; displaying the difference image on a monitor; updating the parent image in response to a first outside instruction by replacing the parent image with the latest image; displaying, on the monitor, the difference image based on the updated parent image; and collecting a photographic image in response to a second outside instruction.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrates presently preferred embodiments of the invention, and together with the general description given above and the detailed description of the preferred embodiments given below, serve to explain the principles of the invention.

DETAILED DESCRIPTION OF THE INVENTION

An embodiment of the invention will be described with reference to the accompanying drawings.

Figure 5:
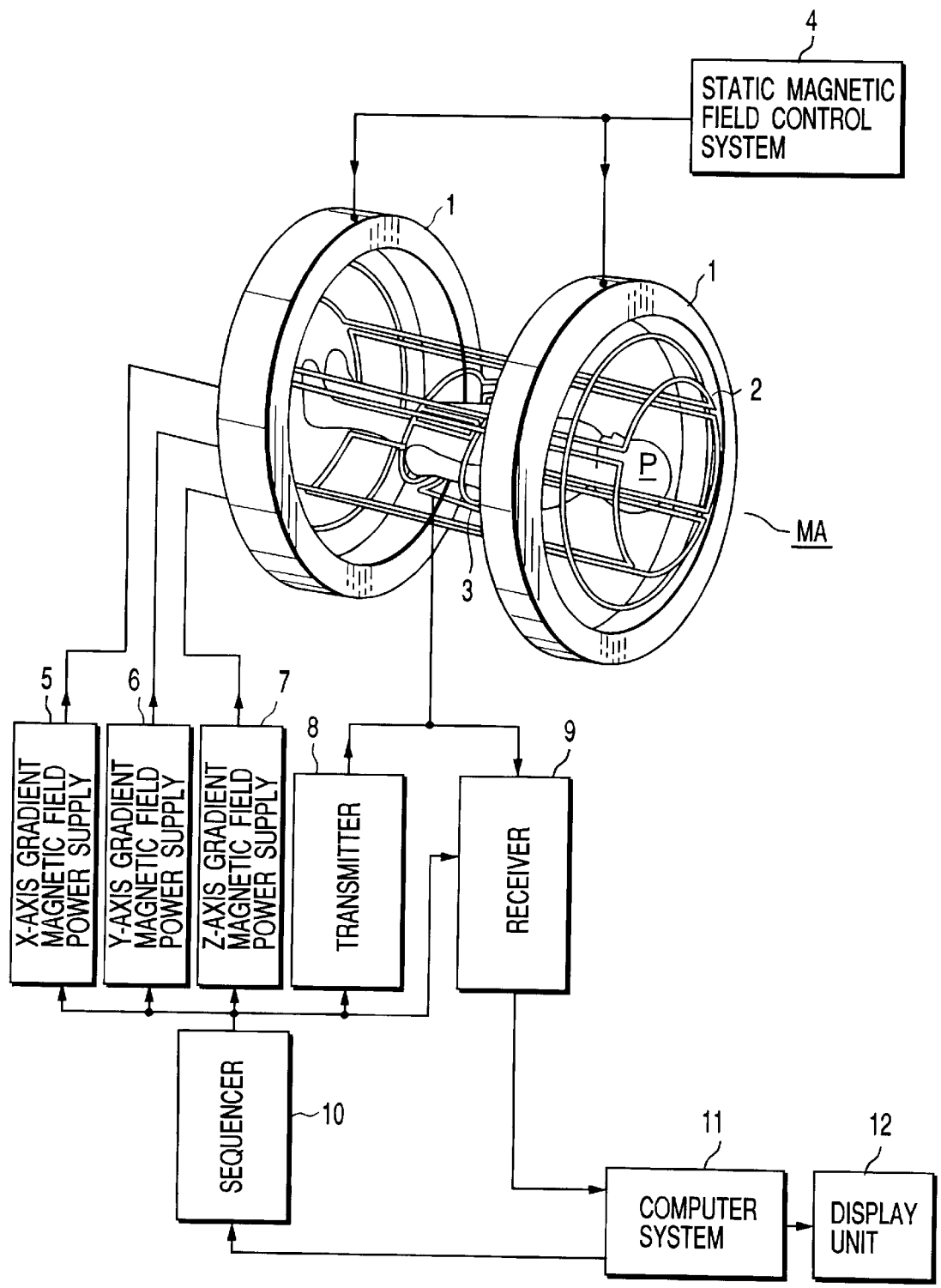
FIG. 5 is a schematic block diagram illustrating the configuration of a magnetic resonance imaging apparatus.

The exemplary embodiment relates to a magnetic resonance imaging apparatus equipped with a so-called Visual Prep function. FIG. 5 is a schematic block diagram illustrating the configuration of the magnetic resonance imaging apparatus. As shown in the figure, a magnet assembly MA for receiving a to-be-examined subject P comprises superconducting or normal conducting static magnetic field coils 1 for generating a high-intensity static magnetic field, three gradient magnetic field coils 2 for generating gradient magnetic fields along the X-, Y- and Z-axes, a signal-sending/receiving coil 3 for excitation and signal collection, and a static magnetic field control system 4 for executing excitation control of the static magnetic field coil 1 and coolant supply control.

The X-, Y- and Z-axis gradient magnetic field coils 2 are controlled by X-, Y- and Z-axis gradient magnetic field power supplies 5, 6 and 7, respectively. The signal-sending/receiving coil 3 is driven by a transmitter 8 when sending a signal (excitation), and driven by a receiver 9 when receiving a signal (signal collection).

The magnetic resonance imaging apparatus comprises a sequencer 10 for causing the X-, Y- and Z-axis gradient magnetic field power supplies 5, 6 and 7, the transmitter 8 and the receiver 9 to execute sequential generation of gradient magnetic fields and sending/receiving signals, a computer system 11 for executing various processes relating to reconstruction of a magnetic resonance image, and a display unit 12 for displaying the magnetic resonance image created by the computer system 11.

Figure 1:
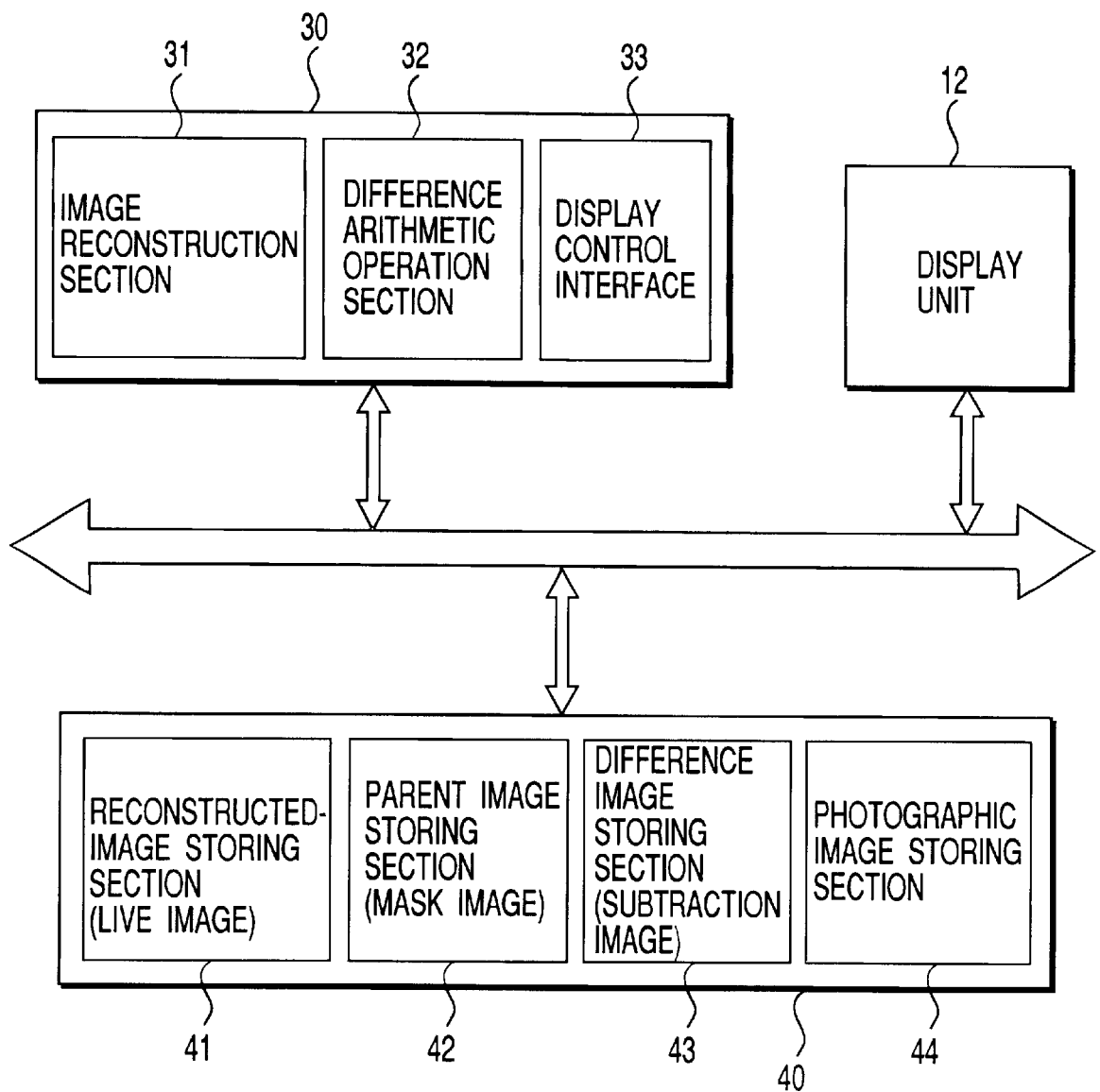
FIG. 1 is a schematic block diagram showing a computer system and a display system, which are incorporated in a magnetic resonance imaging apparatus according to the present invention.

FIG. 1 is a schematic block diagram showing a computer system and a display system, which are incorporated in a magnetic resonance imaging apparatus according to the invention.

A computer system 11 shown in FIG. 5 has an image processing unit 30 and an image storing unit 40. The image processing unit 30 includes an image reconstructing section 31, a difference arithmetic operation section 32 and a display control interface 33. The image storing unit 40 includes a reconstructed-image (live image) storing section 41, a parent image (mask image) storing section 42, a difference image (subtraction image) storing section 43 and a photographic image storing section 44.

The image reconstructing section 31 reconstructs a magnetic resonance image of a to-be-examined subject on the basis of magnetic resonance image data concerning the subject output from the receiver 9.

The difference arithmetic operation section 32 generates a difference image on the basis of a parent image stored in the parent image storing section 42 and a reconstructed image stored in the reconstructed-image storing section 41, and stores it in the difference image storing section 43.

The display unit 12 periodically reads reconstructed images stored in the reconstructed-image storing section 41, or difference images stored in the difference image storing section 43, thereby continuously displaying them on a monitor. Further, the display unit 12 displays a photographic image stored in the photographic image storing section 44.

A rough description will now be given of the procedure of MR contrast imaging using the magnetic resonance imaging apparatus configured as above, and the Visual Prep function.

First, a contrast agent is injected into a to-be-examined subject by an operator, and a monitor scan is executed. On the basis of a monitor image obtained by the monitor scan, the operator observes the flow state of contrast agent. After confirming that the contrast agent has reached a to-be-photographed target, the operator inputs an instruction to execute an imaging scan, i.e. main scan for acquiring a photographic MR image used for diagnosis.

The Visual Prep function enables visual confirmation, based on the monitor scan, of the fact that contrast agent has reached a to-be-photographed target, and hence enables easy determination of timing for inputting an instruction to execute an imaging scan.

A monitor image displayed during the monitor scan is a normal reconstructed image or a difference image such as an absolute difference image or a raw-data difference image. The difference image is an image obtained by subjecting, to image difference processing (also called "subtraction processing"), a predetermined parent image (mask image) obtained earlier and a live image obtained at the present point in time. This image indicates only the contrast agent that is extracted as a result of removing a stationary subject by subtraction. As will be described later, the parent image can be updated by the operator at a voluntary point in time.

Gd-DPTA (gadolinium diethylenetriamine pentaacetic acid), for example, is known as a contrast agent to be injected into a subject. Contrast agents for MRI mainly serve (1) to impart contrast to tissue, (2) to make it easy to observe a tissue function, (3) to make it easy to observe a metabolic pathway, etc.

Figure 2:
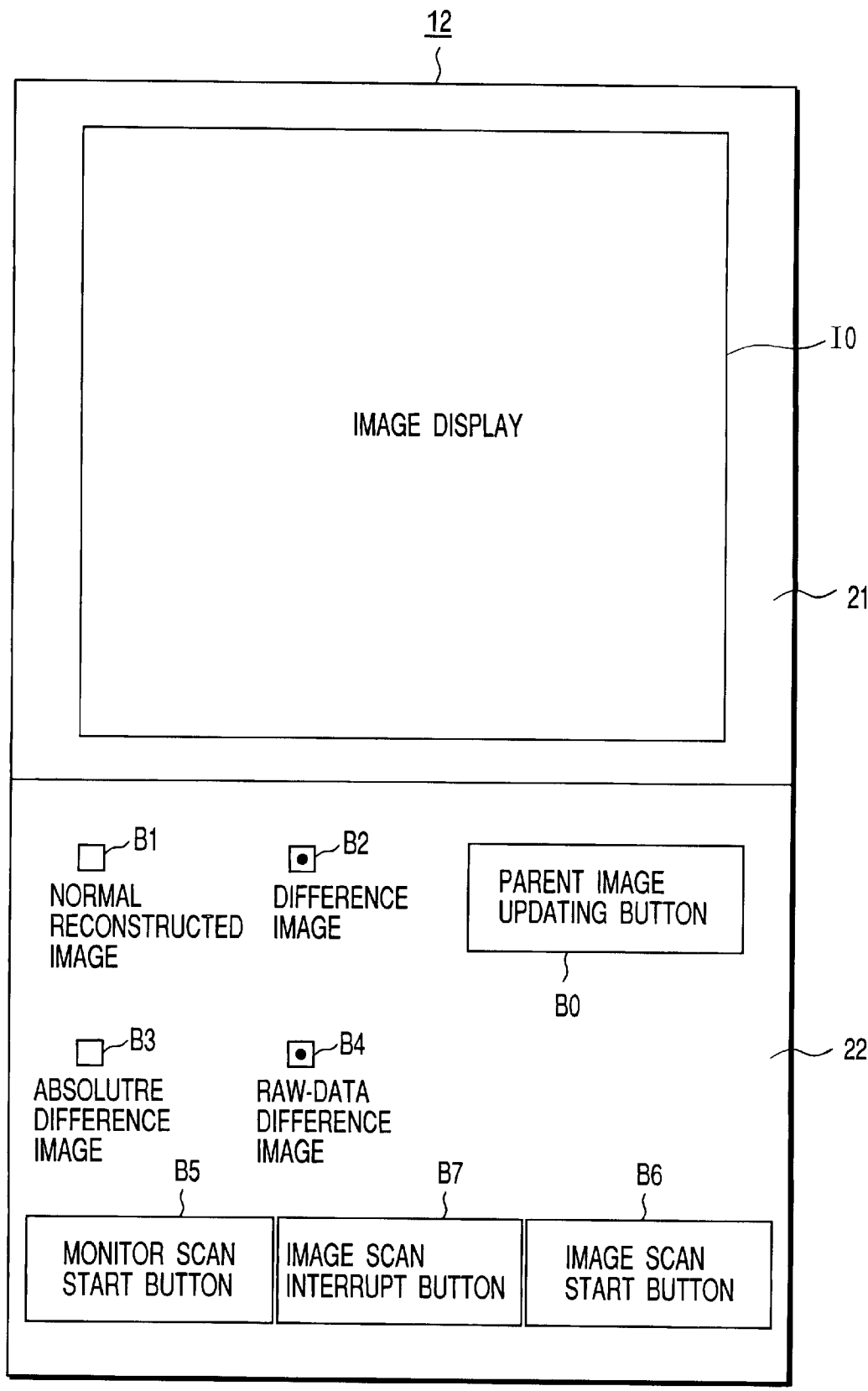
FIG. 2 is a view illustrating an example of a first screen for a Visual Prep function according to an embodiment of the present invention.

FIG. 2 is a view illustrating an example of a first screen for the Visual Prep function. The first screen is set on a display unit 12 when executing the Visual Prep function, and includes an image display area 21 and an operation button area 22.

The image display area 21 displays a monitor image I0 obtained via the computer system 11. The monitor image I0 is a normal reconstructed image or a difference image. Where a difference image is designated, the monitor image 10 is an absolute difference image or a raw-data difference image. The first screen can display only one image at a time, but the image is of a greater size than in a second screen described later.

The operation button area 22 is an area to be used by the operator to mainly input instructions to execute a scan, to change the displayed image, or to update the parent image, which is the feature of this embodiment. A plurality of buttons B0–B7 are arranged in the operation button area 22. These buttons can be clicked by the operator using, for example, a mouse (not shown), and include a parent image updating button B0, a normal reconstructed-image button B1, a difference image button B2, an absolute value image button B3, a raw-data difference image button B4, a monitor scan start button B5, an imaging scan start button B6 and an imaging scan interrupt button B7.

When a screen switching button (not shown) has been operated at any particular point in time while the first screen is set on the display unit 12, the screen is switched from the first screen to the second screen, which will now be described.

Figure 3:
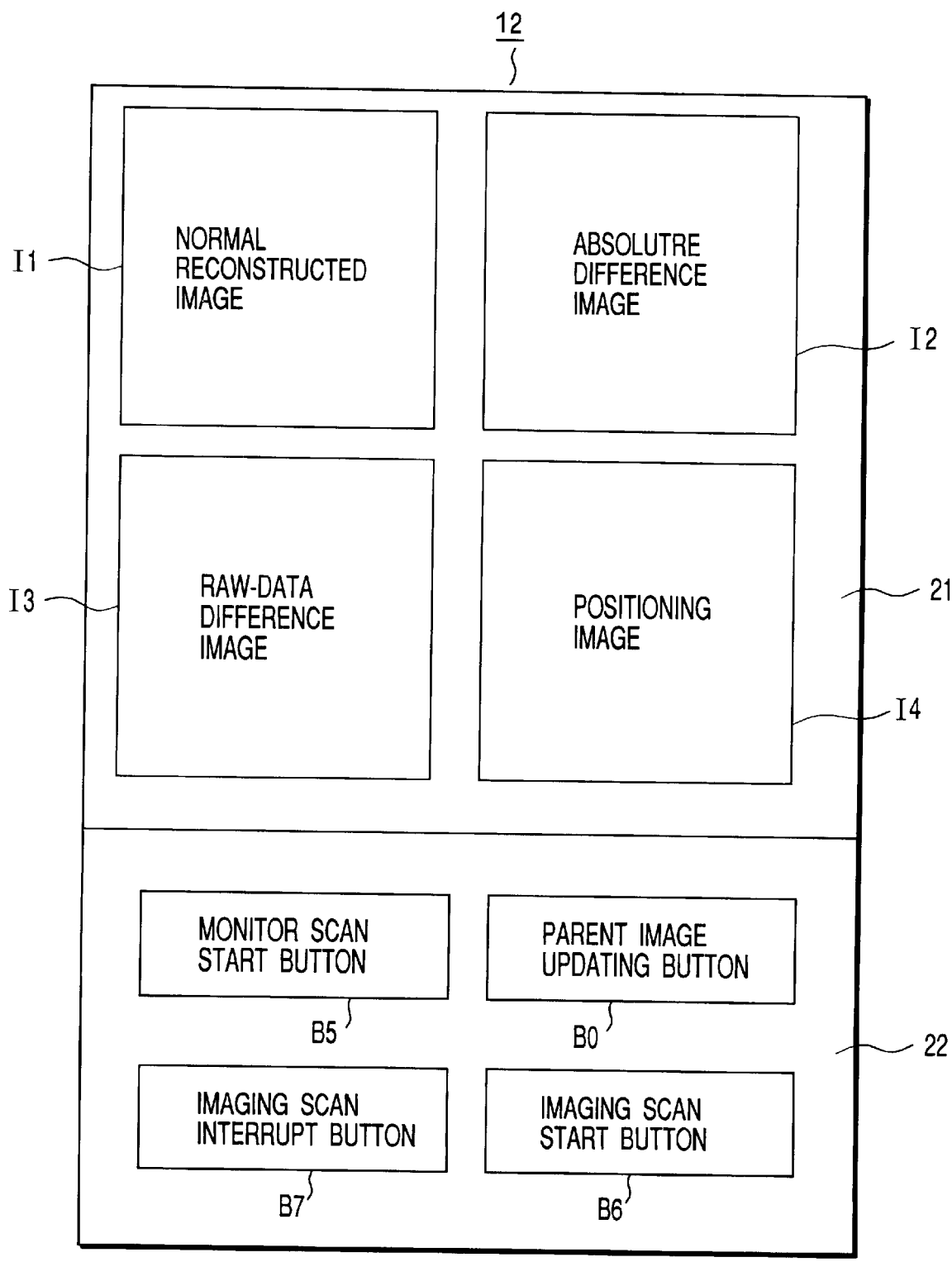
FIG. 3 is a view illustrating an example of a second screen for the visual prep function according to an embodiment of the present invention.

FIG. 3 shows an example of the second screen.

Like the first screen, the second screen is set on a display unit 12 when executing the visual prep function, and includes an image display area 21 and an operation button area 22. The second screen differs from the first screen in that, in the former, a plurality of images can be displayed simultaneously in the image display area 21.

The image display area 21 simultaneously displays a normal reconstructed image 11, an absolute value difference image 12, a raw-data difference image 13 and a positioning image 14.

Since the second screen simultaneously displays a plurality of images, the operation button area 22 does not have any button for designating the image type of a to-be-displayed object. More specifically, the normal reconstructed-image button B1, the difference image button B2, the absolute value image button B3 and the raw-data difference image button B4 are not included. The button area only includes the parent image updating button B0, the monitoring scanning start button B5, the imaging scanning start button B6 and the imaging scanning interrupt button B7.

When the aforementioned screen switching button has been operated at a voluntary point in time while the second screen is set on the display unit 12, the screen is switched from the second screen to the first screen.

The operation of the embodiment constructed as above will be described.

Figure 4:
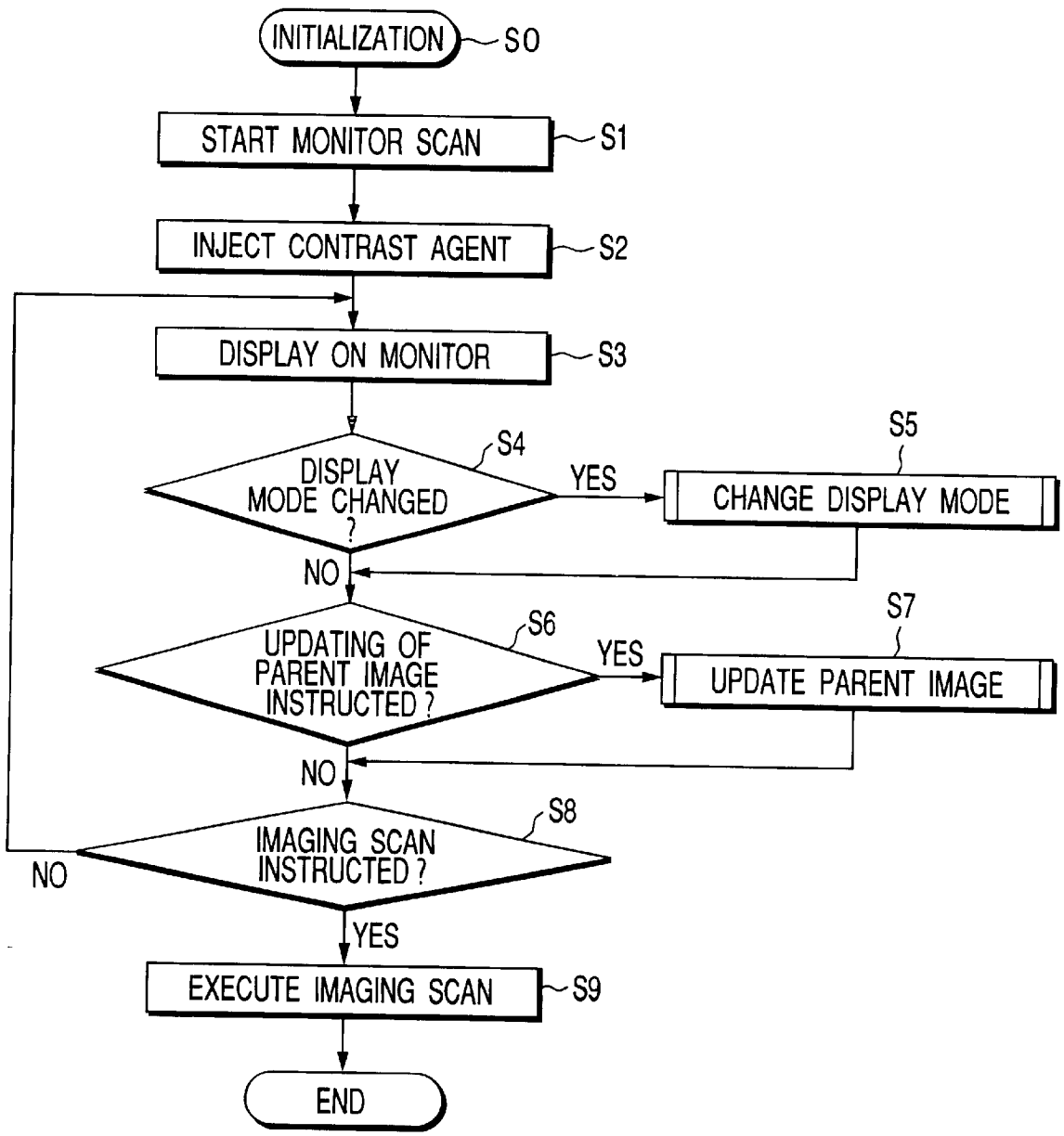
FIG. 4 is a flowchart useful in explaining the operation of an embodiment of the invention.

FIG. 4 is a flowchart useful in explaining the operation of the embodiment.

When the operator has input an instruction to start MR contrast imaging using the Visual Prep function, first, initialization is executed at a step S0. During initialization, the first screen, for example, is set as a default, and an absolute value difference image is displayed as the monitor image I0 on the first screen. If necessary, it is preferable that an image suitable for the monitor display is obtained in advance by executing contrast adjustment processing enlarging/reducing processing, etc.

Subsequently, the operator clicks the monitor scan start button B5 on the first screen, thereby causing the MRI apparatus to start the monitor scan. A first image obtained upon the start of the monitor scan is stored as the parent image in the parent image storing section 42 (step S1).

After that, a contrast agent is injected into a to-be-examined subject by an operator such as a doctor (step S2).

Images (absolute value images) of the subject are created at regular intervals, and each of these images and the previously stored parent image are subjected to image difference processing, thereby obtaining and displaying a difference image on the display (step S3). The displayed difference image only indicates the injected contrast agent since an image corresponding to the body of the subject is removed by the image difference processing. In the image difference processing, predetermined weighted processing may be executed on a to-be-processed image so as to obtain an appropriate image.

At the next step S4, it is determined whether or not a button relating to switching of display for different types of images has been clicked (pushed). If it is detected that the button B1 has been clicked, the present screen for absolute value difference images is switched to a screen for normal reconstructed images. Further, if the button B4 is clicked with the button B2 already clicked, the present screen for absolute value difference images is switched to screen for raw-data difference images (step S5).

This type of switching of screens can be repeated at any desired time point during the monitoring display. The processing at the step S4 is skipped while the second screen is set.

The absolute value difference image is effective for the movement of a to-be-photographed subject, i.e. movement of the body of a to-be-examined subject. On the other hand, in the case of the raw-data difference (complex difference) image, a signal indicating the inflow of blood is positive and hence stable display is realized.

During the display of a monitor image, it is possible that the parent image used in present difference processing will become inappropriate because of movement of the body of the subject, breathing or inflow effect of blood. In such a case, the operator clicks the parent image updating button B0 to thereby update the parent image.

It is determined at a step S6 whether or not the operator has input an instruction to update the parent image. If the operator clocks the parent image updating button B0 at a voluntary time point during the monitor image display, the stored parent image is replaced with an image presently obtained, thereby updating the parent image (step S7). After that, a difference image based on the updated parent image is displayed. In a manner similar to the switching for different types of images, the parent image can be updated anytime.

Upon confirming from the monitor image that the contrast agent has reached a to-be-photographed target, the operator clicks the imaging scan start button B6. As a result, imaging scan is executed in place of the monitor scan, thereby obtaining a desired MR contrast image (step S9). If the imaging scan interrupt button B7 is clicked, the imaging scan is promptly interrupted, although the flowchart of FIG. 4 does not show it.

As described above, the exemplary embodiment realizes more effective display of a monitor image relating to the Visual Prep function. In other words, the parent image of a difference image can be updated at a voluntarily chosen time point, and further the type of a to-be-displayed image can be changed in accordance with, for example, a to-be-monitored portion of a subject body. On the basis of such a monitor image, the operator can clearly see the flow of contrast agent. Accordingly, the operator is less likely to fail to determine the right moment for instructing the apparatus to start a series of imaging operations, i.e. the time point of instructing the apparatus to execute photography. As a result, a desired MR contrast image can be more easily and reliably obtained. This means that the possibility of failure of MR contrast photography is low, and hence strain on the body of a to-be-examined subject can be reduced.

As described above, the present invention can provide a magnetic resonance imaging apparatus capable of effectively displaying a monitor image that indicates the flow of a contrast agent in a to-be-examined subject, thereby enabling the operator to more easily choose the timing for photography.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An image display method employed in a magnetic resonance imaging apparatus that executes preparatory imaging, said method comprising:
    collecting sequentially in time a series of magnetic resonance images of a to-be-examined subject, which are to be used for preparatory imaging, by controlling the magnetic resonance imaging apparatus;
    determining at least one of the series of magnetic resonance images to be a parent image;
    creating a difference image between a latest one of the series of magnetic resonance images and the parent image;
    displaying the difference image on a monitor;
    updating the parent image in response to a first input instruction by replacing and thus resetting the parent image with the latest image;
    displaying, on the monitor, the difference image based on the updated parent image; and
    collecting a diagnostic image in response to a second input instruction by controlling the magnetic resonance imaging apparatus.

2. A method as in claim 1, wherein said difference image includes an absolute difference between the parent image and the latest image.

3. A method as in claim 1, wherein said difference image includes a complex difference between the parent image and the latest image.

4. A method as in claim 1, further comprising displaying a normal reconstructed image corresponding to the latest image on the monitor.

5. A method as in claim 4, further comprising switching an image displayed on the monitor between the difference image and said normal reconstructed image in response to a third input instruction.

6. A magnetic resonance imaging apparatus for executing preparatory imaging, said apparatus comprising:

a collecting unit for collecting sequentially in time a series of magnetic resonance image data items concerning a to-be-examined subject, which are to be used for preparatory imaging, by controlling the magnetic resonance imaging apparatus;

a reconstructing unit for reconstructing a series of magnetic resonance images using the series of magnetic resonance image data items collected by the collecting unit;

a parent image storing section for storing, as a parent image, at least one of the series of magnetic resonance images reconstructed by the reconstructing unit;

a difference image generating unit for generating a difference image between a latest one of the series of magnetic resonance images reconstructed by the reconstructing unit, and the parent image stored in the parent image storing section;

a display unit for displaying thereon, as a monitor image, the difference image created by the difference image generating unit; and a display control interface responsive to a first input instruction for updating the parent image stored in the parent image storing section, by replacing and thus resetting the parent image with the latest image, wherein the difference image based on the parent image updated by the display control interface is displayed by the display unit, and a diagnostic image is acquired by the collecting unit and the reconstructing unit in response to a second input instruction, by controlling the magnetic resonance imaging apparatus.

7. A method as in claim 6, wherein said difference image includes an absolute difference between the parent image and the latest image.

8. A method as in claim 6, wherein said difference image includes a complex difference between the parent image and the latest image.

9. A method as in claim 6, wherein said display unit displays a normal reconstructed image corresponding to the latest image.

10. A method as in claim 9, wherein said display control interface is responsive to a third input instruction for switching an image displayed thereon between the difference image and the normal reconstructed image.

11. A method as in claim 9, wherein said display control interface is responsive to a fourth input instruction for switching data displayed thereon between an absolute difference of the difference image and a complex difference of the difference image.

12. A method as in claim 6, wherein said difference image generating unit generates the difference image after executing predetermined weighted operations on one of the latest image and the parent image.

13. A magnetic resonance imaging apparatus for collecting and displaying sequentially in time a series of magnetic resonance images, by controlling the magnetic resonance imaging apparatus and used in preparation acquiring a diagnostic image, and obtaining a diagnostic image at a time point designated by an operator on the basis of displayed images, said apparatus comprising:

storage means for storing, as a parent image, at least one of the series of magnetic resonance images;

image creating means for creating a difference image based on at least one of the series of magnetic resonance images and the parent image stored in the storage means wherein the parent image is, upon an operator input command, reset by assigning a different magnetic resonance image as the parent image; and monitor display means for selectively displaying the difference image created by the image creating means and one of a series of normally reconstructed magnetic resonance images.

14. A magnetic resonance imaging apparatus for collecting and displaying sequentially in time a series of magnetic resonance images, by controlling the magnetic resonance imaging apparatus and used in preparation for acquisition of a diagnostic image, and obtaining a diagnostic image at a time point designated by an operator on the basis of displayed images, said apparatus comprising:

storage means for storing, as a parent image, at least one of the series of magnetic resonance images;

image creating means for creating a difference image based on at least one of the series of magnetic resonance images and the parent image stored in the storage means wherein the parent image is, upon an operator input command, reset by assigning a different magnetic resonance image as the parent image; and monitor display means for simultaneously displaying the difference image created by the image creating means and a series of normally reconstructed magnetic resonance images.

15. A magnetic resonance imaging method, comprising:

(a) obtaining a mask image of a to-be-examined subject, collected by a magnetic resonance imaging apparatus;

(b) collecting a live image of the subject by controlling the magnetic resonance imaging apparatus;

(c) creating a difference image between the mask image and the live image;

(d) displaying the difference image on a monitor;

(e) updating the difference image by repeating (b)–(d), (f) collecting a diagnostic image in response to an input instruction by controlling the magnetic resonance imaging apparatus, and (g) wherein the mask image is, upon an operator input command, reset by assigning a live image as the mask image.

16. A magnetic resonance imaging apparatus, comprising:

a scanning unit for generating a static magnetic field, gradient magnetic fields and RF pulses and receiving magnetic resonance signals from a subject;

a control unit for controlling the scanning unit according to a predetermined sequence;

wherein the control unit includes: means for obtaining sequentially in time a series of magnetic resonance images of the subject by controlling the scanning unit;

means for assigning an arbitrary one of the series of magnetic resonance images as a mask image;

means for creating a difference image between the mask image and a live image newly obtained from the scanning unit, the difference image being updated based on the latest live image;

operation means for inputting an input scan start instruction to start collection of a photographic image by controlling the scanning unit;

a monitor for displaying at least one of the mask image, the live image, the difference image and the photographic image; and wherein the mask image is, upon an operator input command, reset by assigning a live image as the mask image.

17. A method for magnetic resonance imaging, said method A comprising:

performing preparatory MR imaging by acquiring and displaying sequentially in time a series of differential images, each representing the difference between an earlier acquired mask image and a subsequently acquired image;

during said preparatory MR imaging, updating and thereby resetting said mask image to a more recently acquired image in response to an operator command so that appropriate differential images can thereafter continue to be generated after movement artifact degradation in the preparatory MR imaging has been observed by the operator; and performing diagnostic MR imaging in response to another operator command at a time determined by the operator as being a desired time based on observation of said preparatory imaging.

* * * * *